US012642047B2

(12) United States Patent
Chuttar et al.

(10) Patent No.: US 12,642,047 B2
(45) Date of Patent: May 26, 2026

(54) LIFT ASSEMBLY FOR SEMICONDUCTOR MANUFACTURING PROCESSING CHAMBER

(71) Applicant: Applied Materials, Inc., Santa Clara, CA (US)

(72) Inventors: Aditya Chuttar, Sunnyvale, CA (US); Muhannad Mustafa, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 402 days.

(21) Appl. No.: 18/143,301

(22) Filed: May 4, 2023

(65) Prior Publication Data

US 2024/0371673 A1      Nov. 7, 2024

(51) Int. Cl.
  *H10P 72/30*        (2026.01)
  *H10P 72/76*        (2026.01)
(52) U.S. Cl.
  CPC ...... *H10P 72/3302* (2026.01); *H10P 72/7612* (2026.01)
(58) Field of Classification Search
  CPC ......... H01L 21/68742; H01L 21/67742; H01L 21/67167; H01L 21/6719; H01L 21/67196; H01L 21/68771; H10P 72/3302; H10P 72/7612
  See application file for complete search history.

(56) References Cited

U.S. PATENT DOCUMENTS

| | | | |
|---|---|---|---|
| 5,879,128 A | 3/1999 | Tietz et al. | |
| 6,148,762 A | 11/2000 | Fukuda et al. | |
| 6,646,857 B2 | 11/2003 | Anderson et al. | |
| 8,846,163 B2 | 9/2014 | Kao et al. | |
| 10,020,187 B2 | 7/2018 | Hawrylchak et al. | |
| 10,186,445 B2 | 1/2019 | Male et al. | |

(Continued)

FOREIGN PATENT DOCUMENTS

| | | |
|---|---|---|
| CN | 100440476 C | 12/2008 |
| JP | 2008153510 A | 7/2008 |

OTHER PUBLICATIONS

PCT International Search Report and Written Opinion in PCT/US2024/027613 dated Aug. 21, 2024, 10 pages.

*Primary Examiner* — Kaitlin S Joerger
(74) *Attorney, Agent, or Firm* — SERVILLA WHITNEY LLC

(57) ABSTRACT

Apparatuses and methods for loading and unloading substrates from a semiconductor manufacturing processing chamber are described. Some embodiments advantageously provide improved lift assemblies (e.g., lift ring designs) for centering lift pins in semiconductor processing chambers by allowing for unconstrained translation of the lift pins in the x-y plane. Some embodiments advantageously prevent lift pin tilting. Some embodiments advantageously provide a seal between the top end portion of the lift pins and the openings in the top surface. The lift assemblies include a ring-shaped body, a plurality of movable blocks configured to cooperatively interact with one or more openings of the ring-shaped body, and at least one ball bearing. The movable blocks include at least one indentation in a top surface of a bottom portion of the block and a complementary sized ball bearing in the at least one indentation.

20 Claims, 10 Drawing Sheets

(56) References Cited

U.S. PATENT DOCUMENTS

| | | | |
|---|---|---|---|
| 10,192,770 B2 | 1/2019 | Yudovsky | |
| 10,262,888 B2 | 4/2019 | Gangakhedkar et al. | |
| 10,438,833 B2 | 10/2019 | Severson et al. | |
| 2007/0089672 A1 | 4/2007 | Shimamura | |
| 2011/0014396 A1 | 1/2011 | Polyak | |
| 2014/0097175 A1 | 4/2014 | Yu et al. | |
| 2017/0011892 A1* | 1/2017 | Guo | H01L 21/68735 |
| 2018/0114716 A1 | 4/2018 | Hao et al. | |
| 2019/0080955 A1* | 3/2019 | Lee | G03F 7/70691 |
| 2020/0361094 A1 | 11/2020 | Zucker et al. | |
| 2021/0233799 A1 | 7/2021 | Sarode et al. | |
| 2022/0106683 A1 | 4/2022 | Baluja et al. | |
| 2022/0152668 A1 | 5/2022 | Ulavi et al. | |
| 2022/0165551 A1* | 5/2022 | Pei | H01J 37/32642 |
| 2022/0293451 A1* | 9/2022 | Sulyman | H01L 21/68785 |
| 2022/0406575 A1 | 12/2022 | Park et al. | |
| 2023/0197419 A1* | 6/2023 | Lee | H01L 21/68742 |
| | | | 315/111.21 |
| 2024/0030057 A1* | 1/2024 | Son | H01L 21/67178 |

* cited by examiner

LIFT ASSEMBLY FOR SEMICONDUCTOR MANUFACTURING PROCESSING CHAMBER

TECHNICAL FIELD

Embodiments of the disclosure generally relate to semiconductor manufacturing equipment. In particular, embodiments of the disclosure relate to lift assemblies for semiconductor manufacturing processing chambers.

BACKGROUND

Processing chambers generally capable of processing 300 mm substrates incorporate lift pin assemblies. The substrates are transferred into and out of the processing chamber by a robot blade through an insertion/removal opening in the side of the processing chamber. Lift pins are raised and then lowered under the control of a motor to move the substrate from the robot blade at an upper loading position to a lower processing position in which the substrate is placed on a substrate support. Specifically, a substrate is supported by three lift pins spaced 120 degrees apart and projecting from a lift ring positioned below the lower processing region. The substrate support has a substrate support shaft connected to and extending from a bottom surface of the substrate support. The lift pins have a top end portion and a bottom end portion. Typically, the top end portion of the lift pins extends through openings in the top surface of the substrate support and the bottom end portion of the lift pin projects from an opening in the lift ring.

The lift pins can be titled during operation, e.g., raising and then lowering the substrate from the robot blade at the upper loading position to the lower processing position. While the tilted lift pins still allow the substrate to be placed on the support surface, challenges and drawbacks arise due to the tilted lift pins. In particular, the bolt hole on the lift ring is not aligned with the bolt hole on the substrate support. In order to process the substrates, the lift pins and consequently, the substrates, must be centered. For example, the process gases flow across the substrate surface. If the substrates are not centered, the leading edge and trailing edge of the substrate have different flow streamlines. These flow non-uniformities can be substantially eliminated by properly centering the substrates, though centering is a challenge due to the tilting of the lift pins.

Additionally, when the lift pins are tilted during operation, there may be a gap formed between the top end portion of the lift pins and the openings in the top surface of the substrate support. This gap causes several problems.

First, because the lift ring is raised and lowered and causes the lift pins to be raised and lowered, there may be scraping between the top end portion of the lift pins and the openings in the top surface of the substrate support. Lift pins are already subjected to acceleration and deceleration forces many times over a short period, without the tilting problem. Premature failure of the lift pins results in loss of throughput and expenses associated with repair and replacement of broken or worn out parts.

Second, the gap between the top end portion of the lift pins and the openings in the top surface of the substrate support provides an inadequate seal between the backside of the processing chamber (below the lower processing position) and the substrate processing region. Gases can flow from below the lower processing position to the substrate processing region through the gap and potentially damage the substrate and any film deposited on the substrate.

Accordingly, there is a need for apparatuses and methods to improve substrate loading and unloading in semiconductor processing chambers.

SUMMARY

One or more embodiments of the disclosure are directed to a lift assembly for a semiconductor manufacturing processing chamber. The lift assembly comprises a ring-shaped body having a top surface and a bottom surface defining a thickness of the ring-shaped body, an inner peripheral face and an outer peripheral face defining a width of the ring-shaped body, and a plurality of openings on the top surface and inner peripheral face. The plurality of openings extend through a portion of the thickness and a portion of the width from the inner peripheral face towards the outer peripheral face. Each of the openings have a top portion and a bottom portion, the top portion having a first width and the bottom portion having a second width, the second width greater than the first width. The lift assembly also includes a plurality of movable blocks, each movable block having a top portion and a bottom portion, the top portion having a top surface, the bottom portion having a top surface and a bottom surface, the top portion defining a first width and the bottom portion defining a second width, the second width greater than the first width. The movable block is configured to cooperatively interact with one or more of the plurality of openings of the ring-shaped body, and the movable block comprises a hole extending into the top portion.

Additional embodiments of the disclosure are directed to a semiconductor manufacturing processing chamber. The semiconductor manufacturing processing chamber comprises a substrate support, a substrate support shaft, a lift assembly, and a plurality of lift pins. The substrate support has a support surface and a bottom surface. The support surface has a plurality of openings and is configured to support a wafer during processing. The substrate support shaft is connected to and extends from the bottom surface of the substrate support. The substrate support shaft has a location that is aligned with a central axis of the processing chamber. The lift assembly is spaced a distance from the bottom surface of the substrate support. The lift assembly comprises a ring-shaped body having a top surface and a bottom surface defining a thickness of the ring-shaped body, an inner peripheral face and an outer peripheral face defining a width of the ring-shaped body, and a plurality of openings on the top surface and inner peripheral face. The plurality of openings extend through a portion of the thickness and a portion of the width from the inner peripheral face towards the outer peripheral face. Each of the openings have a top portion and a bottom portion, the top portion having a first width and the bottom portion having a second width, the second width greater than the first width. The lift assembly also includes a plurality of movable blocks, each movable block having a top portion and a bottom portion, the top portion having a top surface, the bottom portion having a top surface and a bottom surface, the top portion defining a first width and the bottom portion defining a second width, the second width greater than the first width. The movable block is configured to cooperatively interact with one or more of the plurality of openings of the ring-shaped body, and the movable block comprises a hole extending into the top portion. The plurality of lift pins are positioned within the plurality of openings in the support surface. The lift pins extend through the bottom surface of the substrate support to the hole in the movable block.

Further embodiments of the disclosure are directed to a processing tool. The processing tool comprises a central transfer station comprising a robot configured to move a wafer, a plurality of process stations, and a controller connected to the central transfer station and the plurality of process stations. Each process station is connected to the central transfer station and provides a processing region separated from processing regions of adjacent process stations. The plurality of process stations comprising at least one semiconductor manufacturing processing chamber, which includes a lift assembly spaced a distance from a bottom surface of a substrate support. The controller is configured to activate the robot to move the wafer between process stations, and to control one or more processes occurring in each of the process stations.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" (also referred to as a "wafer") as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Figure 1:
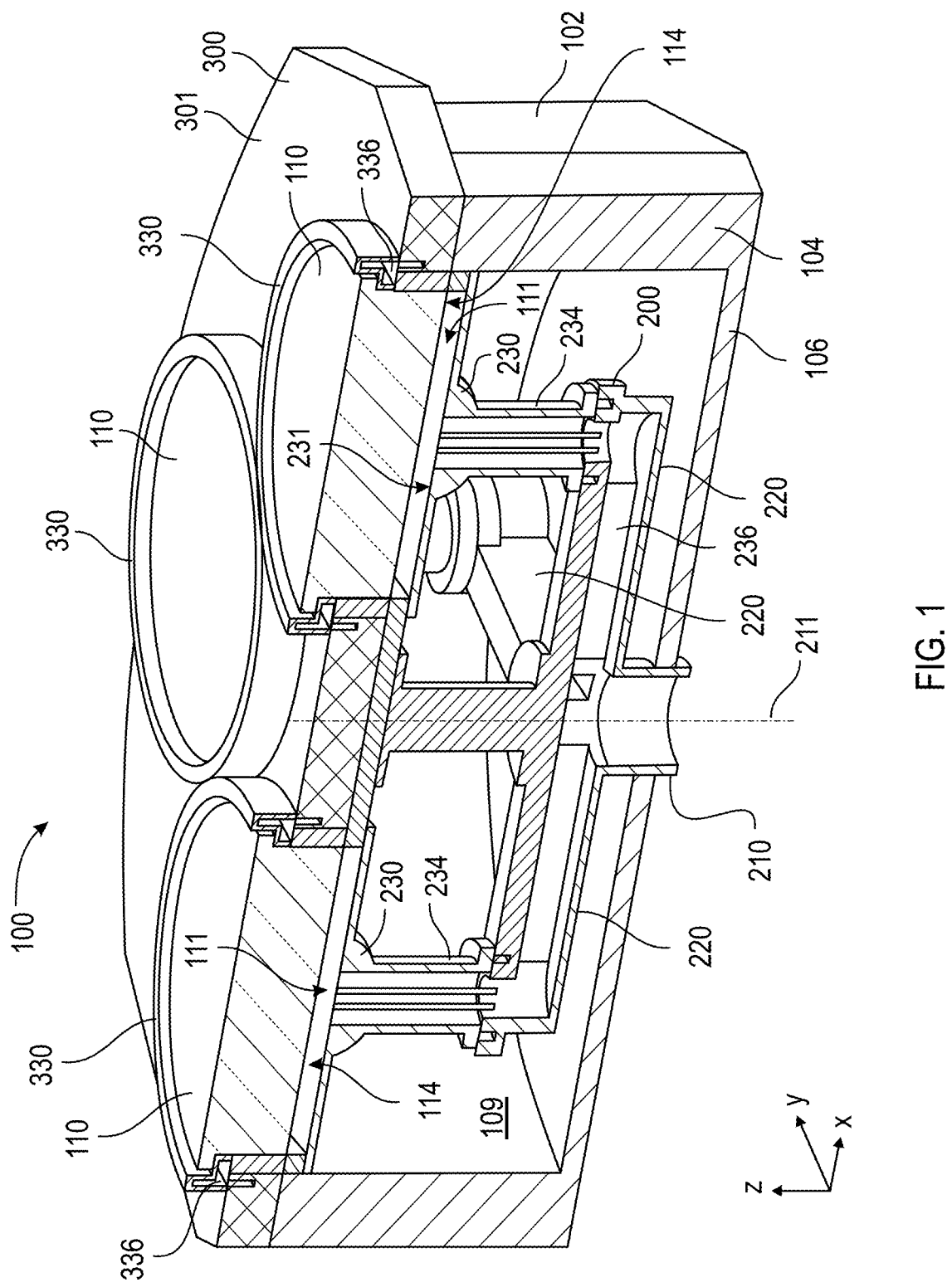
FIG. 1 illustrates a cross-sectional isometric view of a processing chamber in accordance with one or more embodiments of the disclosure.
Figure 2:
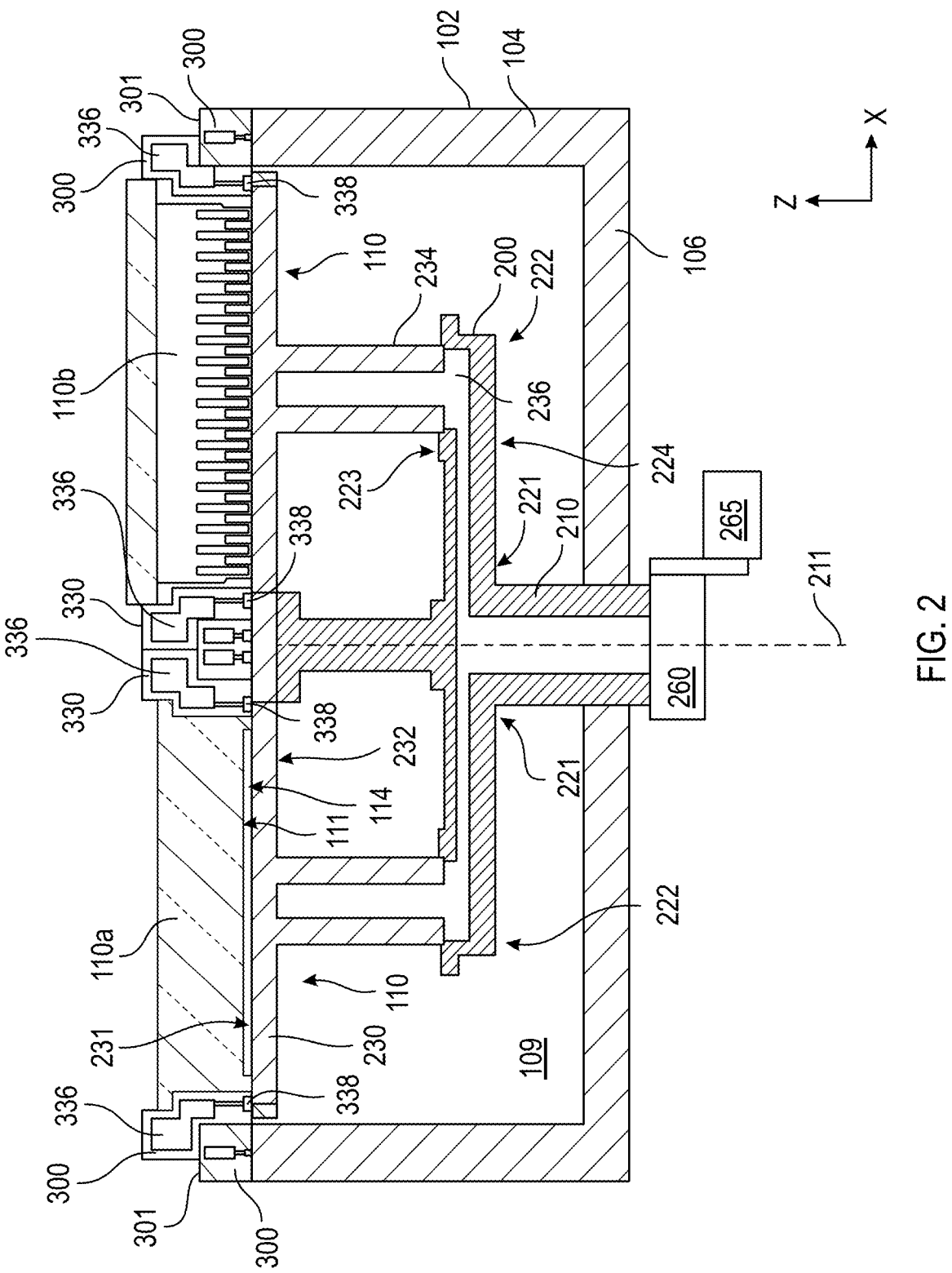
FIG. 2 illustrates a cross-sectional view of a processing chamber in accordance with one or more embodiments of the disclosure.

FIGS. 1 and 2 illustrate a semiconductor manufacturing processing chamber 100 (or "processing chamber 100") in accordance with one or more embodiment of the disclosure. FIG. 1 shows the processing chamber 100 illustrated as a cross-sectional isometric view and in accordance with one or more embodiment of the disclosure. FIG. 2 shows a processing chamber 100 in cross-section according to one or more embodiment of the disclosure.

The processing chamber 100 has a housing 102 with walls 104 and a bottom 106. The housing 102 along with the top plate 300 define an interior volume 109. The processing chamber 100 incorporates a substrate support assembly 200. As used in this manner, an "assembly" refers to a combination of components or parts. A substrate support assembly 200 according to one or more embodiments comprises at least a support shaft 234 and a substrate support 230, as described further below.

The processing chamber 100 illustrated includes a plurality of processing stations 110. The processing stations 110 are located in the interior volume 109 of the housing 102 and are positioned in a circular arrangement around the rotational axis 211 of the substrate support 230. Each processing station 110 comprises a gas injector 112 having a front surface 114. The processing stations 110 are defined as a region in which processing can occur. For example, in some embodiments, a processing station 110 is defined as a process region 111, or process volume 111, bounded by the support surface 231 of the substrate support 230, as described below, and the front surface 114 of the gas injector 112. The gas injector 112, as discussed further below, is a part of the gas distribution assembly 105.

The processing stations 110 can be configured to perform any suitable process and provide any suitable process conditions. The type of gas injector 112 used will depend on, for example, the type of process being performed and/or the type of showerhead or gas distribution plate. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the substrate. The embodiment illustrated in FIG. 2 has a different type of processing station 110 on the left side (processing station 110a) of the Figure than on the right side (processing station 110b) of the Figure. Suitable processing stations 110 include, but are not limited to, thermal processing stations (e.g., chemical vapor deposition (CVD), atomic layer deposition (ALD)), microwave plasma, three-electrode CCP, ICP, parallel plate CCP, physical vapor deposition (PVD), UV exposure, laser processing, pumping chambers, annealing stations and metrology stations.

In some embodiments, the support assembly 200 includes a rotatable center base 210. The rotatable center base 210 defines a rotational axis 211 that extends along a first direction. As a coordinate system, the rotational axis 211 extends along the Z direction so that rotation around the rotational axis 211 occurs in the X-Y plane. The first direction may be referred to as the vertical direction or along the Z-axis; however, it will be understood that use of the term "vertical" in this manner is not limited to a direction normal to the pull of gravity. As used herein, when the center base 210 is "rotated" around the rotational axis 211, the center base 210 is spinning in the X-Y plane. As used herein, movement "along" the rotational axis 211 or the first direction means that the center base 210, or stated component, is moving in the Z-axis.

The support assembly 200 includes at least two support arms 220 connected to and extending from the center base 210. Each of the support arms 220 has a top surface 223 and the bottom surface 224 that define a thickness of the support arm 220. The support arms 220 have an inner end 221 and an outer end 222. The inner end 221 is in contact with the center base 210 so that when the center base 210 rotates around the rotational axis 211, the support arms 220 rotate as well. The support arms 220 of some embodiments are connected to the center base 210 at the inner end 221 by fasteners (e.g., bolts). In some embodiments, the support arms 220 are integrally formed with the center base 210.

In some embodiments, the support arms 220 extend orthogonal to the rotational axis 211 so that one of the inner ends 221 or outer ends 222 are further from the rotational axis 211 than the other of the inner ends 221 and outer ends 222 on the same support arm 220. In some embodiments, the inner end 221 of the support arm 220 is closer to the rotational axis 211 than the outer end 222 of the same support arm 220.

The number of support arms 220 in the support assembly 200 can vary. In some embodiments, there are at least two support arms 220, at least three support arms 220, at least four support arms 220, or at least five support arms 220. In some embodiments, there are three support arms 220. In some embodiments, there are four support arms 220. In some embodiments, there are five support arms 220. In some embodiments, there are six support arms 220.

The support arms 220 can be arranged symmetrically around the center base 210. For example, in a support assembly 200 with four support arms 220, each of the support arms 220 are positioned at 90° intervals around the center base 210. In a support assembly 200 with three support arms 220, the support arms 220 are positioned at 120° intervals around the center base 210. Stated differently, in embodiments with four support arms 220, the support arms are arrange to provide four-fold symmetry around the rotational axis 211. In some embodiments, the support assembly 200 has n-number of support arms 220 and the n-number of support arms 220 are arranged to provide n-fold symmetry around the rotation axis 211. In some embodiments, there is the same number of support arms 220 as process stations 110.

In some embodiments, a support shaft 234 is located at the outer end 222 of each of the support arms 220. The support shaft 234 acts as a standoff to space the substrate support 230 a distance from the top surface 223 of the support arms 220 along the first direction. In one or more embodiments, the support shaft 234 is aligned with the rotational axis 211 (e.g., a central axis) of the processing chamber 100.

A substrate support 230 is positioned at the outer ends 222 of the support arms 220. In some embodiments, the substrate support 230 is positioned on the support shaft 234 at the outer ends 222 of the support arms 220. The center of the substrate supports 230 are located at a distance from the rotational axis 211 so that upon rotation of the center base 210 the substrate supports 230 move in a circular path offset from the rotational axis.

The support assembly 200 of some embodiments is rotated around the rotational axis 211 using a rotation motor 260 connected to the rotatable base 210. In some embodiments, the support assembly 200 is movable along the length of the rotational axis 211 (in the Z-axis direction) using a lift motor 265.

The substrate supports 230 have a support surface 231 configured to support a substrate during processing. In some embodiments, the support surfaces 231 of all of the substrate supports 230 are substantially coplanar. As used in this manner, "substantially coplanar" means that the planes formed by the individual support surfaces 231 are within ±5°, ±4°, ±3°, ±2° or ±1° of the planes formed by the other support surfaces 231.

In some embodiments, a channel 236 is formed in one or more of the center base 210, the support arms 220, support shaft 234 and/or the substrate support 230. The channel 236 can be used to route electrical connections or to provide a gas flow. In some embodiments, the substrate support 230 comprises one or more heating elements (not shown).

The substrate supports 230 of some embodiments are heaters. The heaters can be any suitable type of heater known to the skilled artisan. In some embodiments, the heater is a resistive heater with one or more heating elements within a heater body. Electrical connection to the heaters in some embodiments is routed through the channel 236.

In some embodiments, the substrate supports 230 comprise an electrostatic chuck. The electrostatic chuck can include various wires and electrodes so that a substrate positioned on the heater support surface 231 can be held in place while the substrate support is moved. In some embodiments, the substrate support 230 comprises a heater and an electrostatic chuck. This allows a wafer to be chucked onto a heater at the beginning of a process and remain in that same position on that same heater while moving to different process stations.

Figure 3:
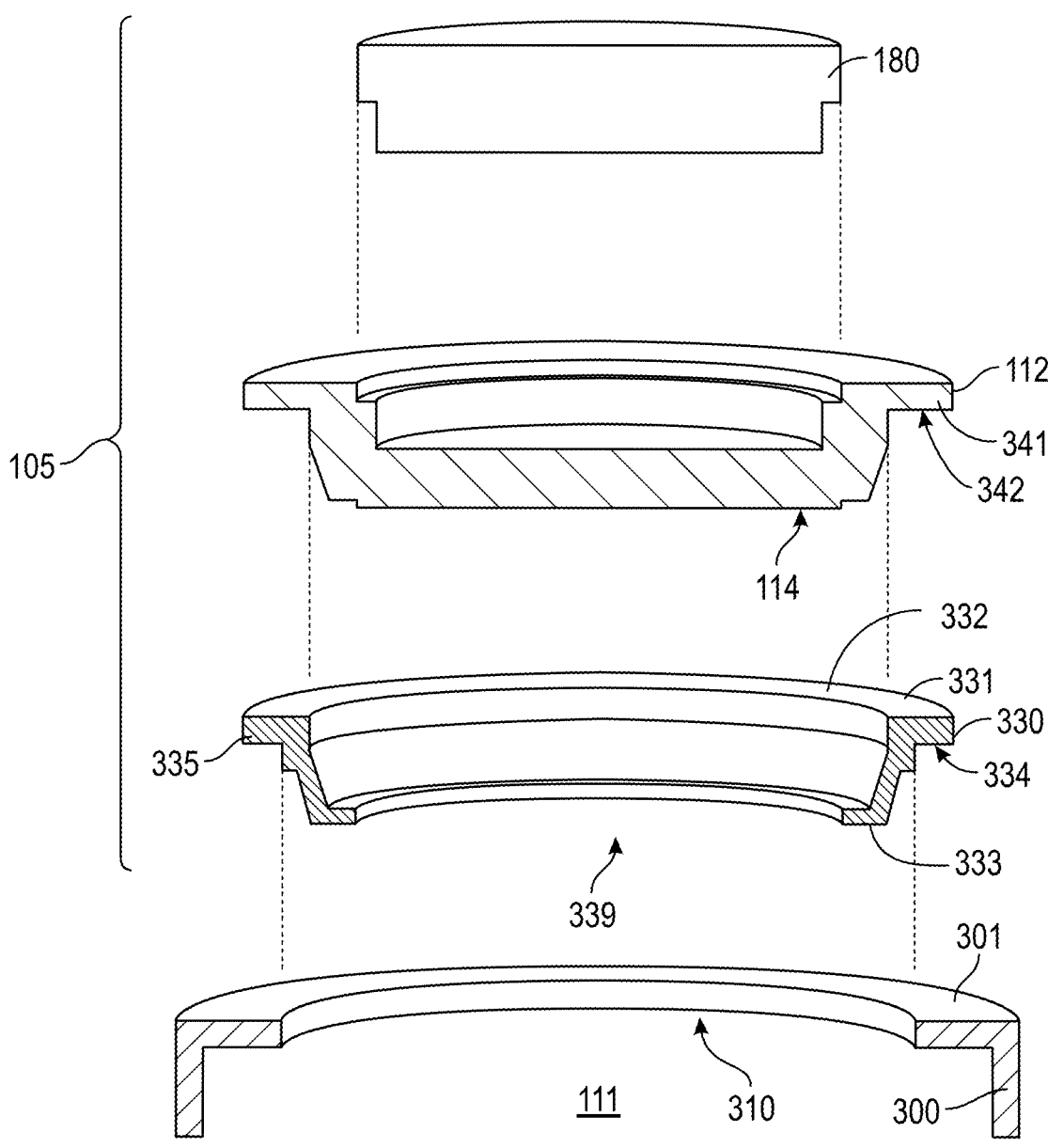
FIG. 3 illustrates an exploded cross-sectional view of a processing station in accordance with one or more embodiments of the disclosure.

FIG. 3 illustrates an exploded view of a gas distribution assembly 105 for use in a processing station 110 or a process chamber in accordance with one or more embodiment of the disclosure. The skilled artisan will recognize that the embodiment illustrated in FIG. 3 is a general schematic representation and omits details (e.g., gas channels). The gas distribution assembly 105 illustrated comprises three main components: a gas distribution plate 112, a lid 180 and an optional spacer 330. The spacer 330 is also referred to as a pump/purge spacer, insert or pump/purge insert, liner or pump/purge liner. In some embodiments, the spacer 330 is connected to or in fluid communication with a vacuum (exhaust). In some embodiments, the spacer 330 is connected to or in fluid communication with a purge gas source.

The openings 310 in the top plate 300 can be uniformly sized or have different sizes. Different sized/shape gas injectors 112 can be used with a pump/purge spacer 330 that is suitably shaped to transition from the opening 310 to the gas distribution plate 112. For example, as illustrated, the pump/purge spacer 330 includes a top 331 and bottom 333 with a sidewall 335. When inserted into the opening 310 in the top plate 300, a ledge 334 configured to be positioned on the top surface 301 of the lid 180 around a periphery of the opening 310.

The pump/purge spacer 330 includes an opening 339 in which a gas distribution plate 112 can be inserted. The gas distribution plate 112 illustrated has a flange 341 with a contact surface 342. The contact surface 342 of the flange 341 is configured to contact the back surface 332 at the top 331 of the pump/purge spacer 330. The diameter or width of the gas distribution plate 112 can be any suitable size that can fit within the opening 339 of the pump/purge spacer 330. This allows gas injectors 112 of various types to be used within the same opening 310 in the top plate 300.

Figure 4:
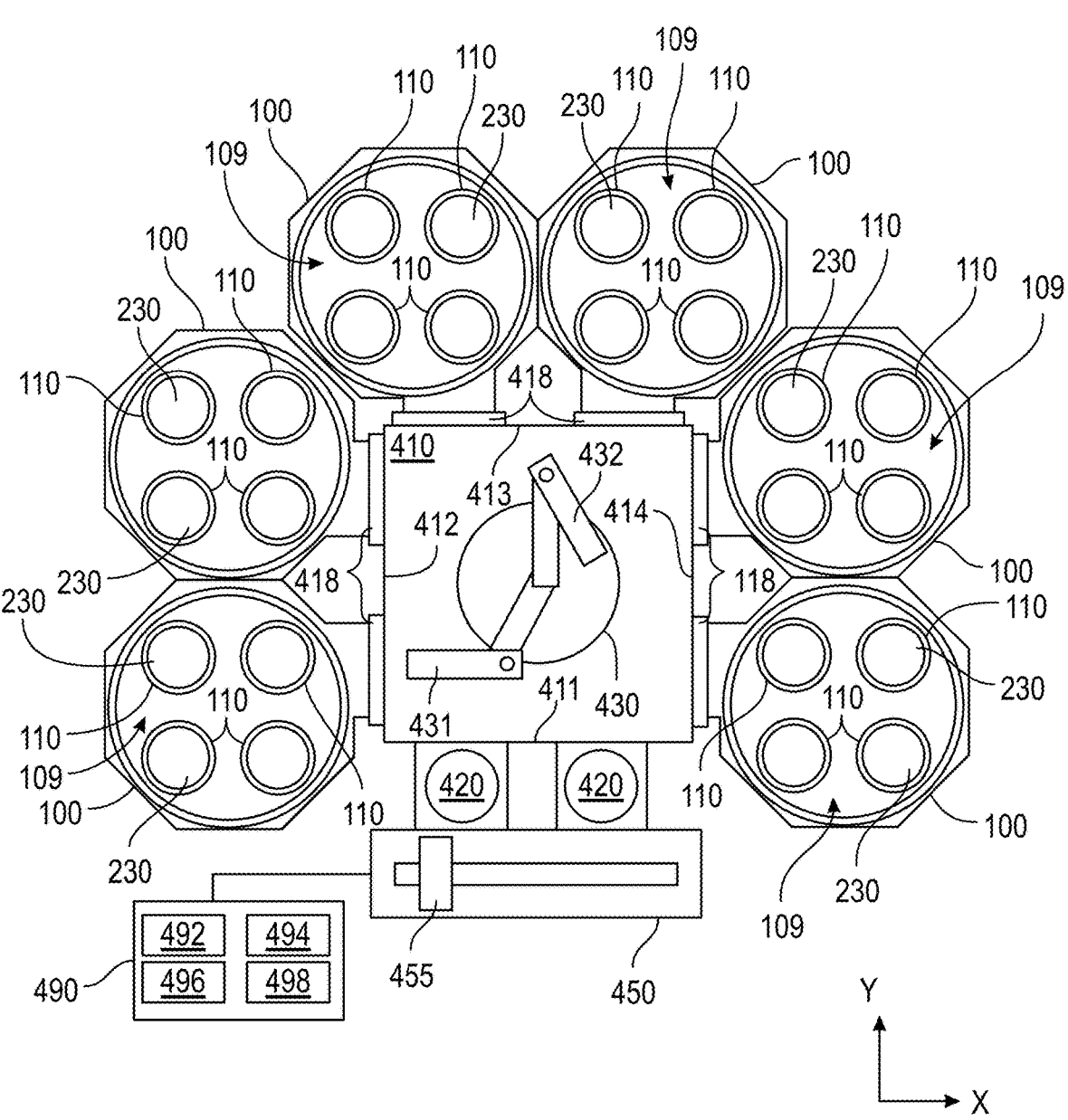
FIG. 4 is a schematic representation of a processing platform in accordance with one or more embodiments of the disclosure.

The pump/purge spacer 330 of some embodiments includes a gas plenum 336 with at least one opening 338 in the bottom 333 of the pump/purge spacer 330. The gas plenum 336 has an inlet (not shown), typically near the top 331 or sidewall 335 of the pump/purge spacer 330. In some embodiments, the plenum 336 is connected to a vacuum pump or other vacuum source to direct gas escaping the process volume 111 through the opening 338 in the bottom 333 of the pump/purge insert 330 to create a gas curtain type barrier to prevent leakage of process gases from the interior of the processing chamber FIG. 4 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different numbers or types of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides, eight sides or more.

The transfer station 410 has a robot 430 positioned therein. The robot 430 can be any suitable robot capable of moving a substrate during processing. In some embodiments, the robot 430 has a first arm 431 and a second arm 432. The first arm 431 and second arm 432 of some embodiments are configured to be moved independently of the other arm. The first arm 431 and second arm 432 of some embodiments are configured to move in the X-Y plane and/or along the Z-axis. In some embodiments, the robot 430 includes a third arm (not shown) or a fourth arm (not shown). Each of the arms can move independently of other arms.

The embodiment illustrated includes six semiconductor manufacturing processing chambers 100 with two connected to each of the second side 412, third side 413 and fourth side 414 of the central transfer station 410. The processes performed in each of the processing chambers 100 is independent of the processes performed in any of the other processing chambers. In some embodiments, all of the processing chambers 100 are configured to perform the same process to improve throughput by a multiple of the number of processing chambers 100.

The illustrated processing platform 400 also includes one or more buffer station 420 connected to the first side 411 of the central transfer station 410. The buffer stations 420 can perform the same or different functions. For example, the buffer stations may hold a cassette of substrates which are processed and returned to the original cassette, or one of the buffer stations may hold unprocessed substrates which are moved to the other buffer station after processing. In some embodiments, one or more of the buffer stations are configured to pre-treat, pre-heat or clean the substrates before and/or after processing. In some embodiments, one or more of the buffer stations are configured to anneal or post-process substrates before and/or after processing.

The processing platform 400 may also include one or more access ports 418 between the central transfer station 410 and any of the processing chambers 100. The access ports 418 are configured to open and close to isolate the interior volume 109 within the processing chamber 100 from the environment within the central transfer station 410. For example, if the processing chamber will generate plasma during processing, it may be helpful to close the access port for that processing chamber to prevent stray plasma from damaging the robot in the transfer station. In some embodiments, all of the processing chambers 100 are configured to perform the same process and the access ports are open throughout as each chamber has process stations 110 that isolate the substrate to a process region 111 during processing.

The processing platform 400 of some embodiments is connected to a factory interface 450 to allow substrates or cassettes of substrates to be loaded into the processing platform 400. A robot 455 within the factory interface 450 can be used to move the substrates or cassettes into and out of the buffer stations. The substrates or cassettes can be moved within the processing platform 400 by the robot 430 in the central transfer station 410. In some embodiments, the factory interface 450 is a transfer station of another cluster tool (i.e., another multiple chamber processing platform).

Some embodiments of the processing platform 400 include a controller 490 coupled to various components of the processing platform 400 to control the operation thereof. The controller 490 of some embodiments controls the entire processing platform 400. In some embodiments, the processing platform 400 includes multiple controllers 490; each configured to control one or more individual portions of the processing platform 400. For example, the processing platform 400 of some embodiments comprises separate controllers for one or more of the individual processing chambers 100, central transfer station 410, factory interface 450 and/or robots 430.

While the controller 490 is illustrated in FIG. 4 as connected to and controlling one or more components of the processing platform 400, the controller 490 may also be connected to a single processing chamber 100. For example, although not included in the Figures, a controller 490 in some embodiments is connected to the processing chamber 100 illustrated and described with respect to FIGS. 1 and 2.

In some embodiments, at least one controller 490 is coupled to one or more of the processing chamber 100, substrate support assembly 200, flow controller, pressure gauge, pump, feedback circuit, reaction space pressure gauge, gas distribution assembly 105, robot 430, robot 455 or other component used for the operation of the processing platform 400, as the skilled artisan will understand.

The controller 490 may be one of any form of general-purpose computer processor, microcontroller, microprocessor, etc., that can be used in an industrial setting for controlling various chambers and sub-processors. The at least one controller 490 of some embodiments has a processor 492, a memory 494 coupled to the processor 492, input/output devices 496 coupled to the processor 492, and support circuits 498 to communication between the different electronic components. The memory 494 of some embodiments includes one or more of transitory memory (e.g., random access memory) and non-transitory memory (e.g., storage).

The memory 494, or a computer-readable medium, of the processor may be one or more of readily available memory such as random access memory (RAM), read-only memory (ROM), floppy disk, hard disk, or any other form of digital storage, local or remote. The memory 494 can retain an instruction set that is operable by the processor 492 to control parameters and components of the system. The support circuits 498 are coupled to the processor 492 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

One or more embodiments of the disclosure advantageously provide simple, reliable mechanisms to transfer wafers into and out of spatial multi-substrate processing tools.

Embodiments of the disclosure advantageously provide apparatuses and methods that improve substrate loading and unloading in semiconductor processing chambers. Some embodiments of the disclosure advantageously provide improved lift ring designs for centering of lift pins in semiconductor processing chambers by allowing for unconstrained translation of the lift pins in the x-y plane.

In some embodiments, the lift pins can advantageously be dropped into openings in the pedestal heaters. In some embodiments, the lift pins are electrically and/or thermally conductive. Without intending to be bound by theory, it is thought that the use of conductive materials for the lift pins prevents charge building during processing which can lead to the lift pins sticking. Some embodiments prevent non-uniform chucking of incoming substrates by grounding the substrate until it is fully seated on the substrate support surface. Additionally, it is thought that conductive lift pins ground and discharge electrical charge from the substrate for an outgoing substrate.

Some embodiments of the disclosure advantageously prevent lift pin tilting. Some embodiments of the disclosure advantageously provide a seal between the top end portion of the lift pins and the openings in the top surface of the substrate support.

When conventional lift pins are tilted during operation, there may be a gap formed between the top end portion of the lift pins and the openings in the top surface of the substrate support. This gap causes several problems, described above. Advantageously, embodiments of the disclosure provide lift assembly designs that eliminate a gap between the top end portion of the lift pins and the openings in the top surface of the substrate support.

In some embodiments, the top end of the lift pins has a flared width and extends through openings in the top surface of the substrate support and the openings in the top surface have a complementary flared surface to prevent the top end of the lift pin from passing through the bottom surface of the substrate support and ensure that there is no gap between the top end portion of the lift pins and the openings.

Some embodiments of the disclosure advantageously remove the need for a separate, active lifting motor for lift pin actuation during wafer transfer. In some embodiments, the improved lift ring designs are less intrusive in the process volume, reduce cost and/or decrease substrate transfer times.

In one or more embodiments, a lift assembly 500 for a semiconductor manufacturing processing chamber 100 comprises a ring-shaped body 510, a plurality of movable blocks 600 configured to cooperatively interact with one or more openings 520 of the ring-shaped body 510, and at least one ball bearing 645 on the movable block 600.

Figure 5A:
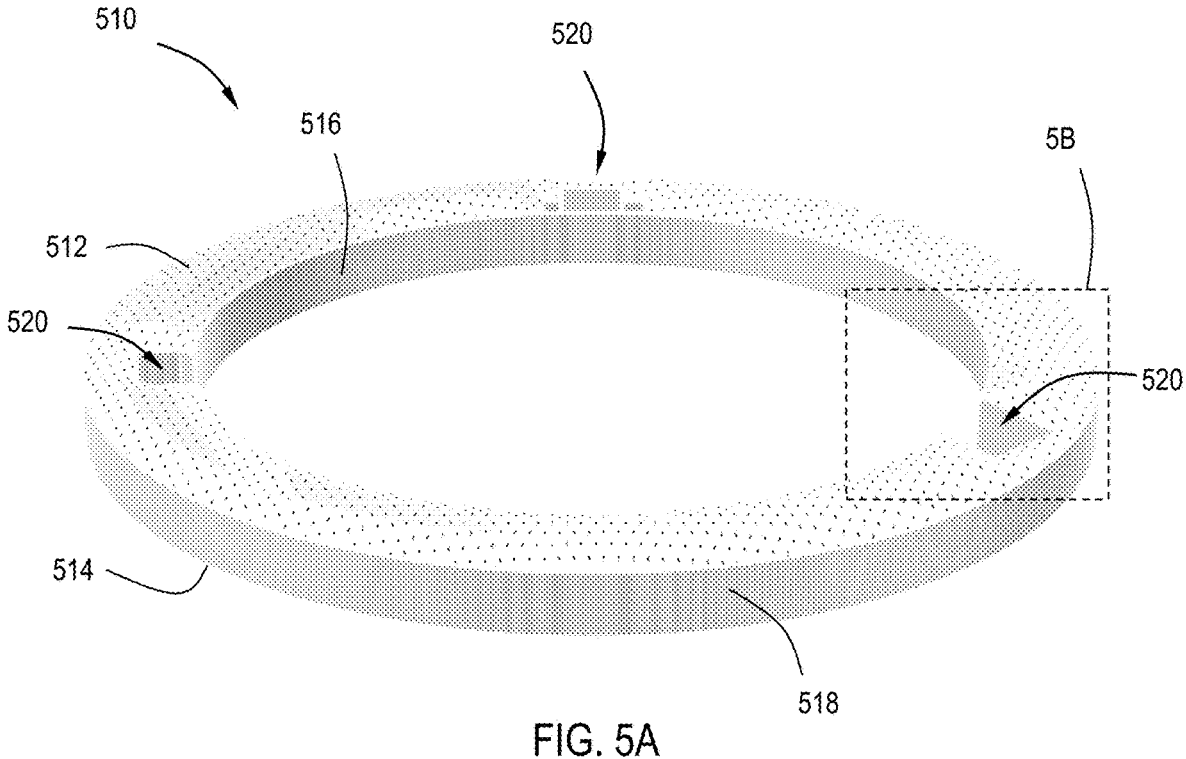
FIG. 5A is a schematic representation of a ring-shaped body of a lift assembly according to one or more embodiments of the disclosure.

FIG. 5A is a schematic representation of the ring-shaped body 510 of the lift assembly 500 according to one or more embodiments of the disclosure. The ring-shaped body 510 may comprise any suitable material. In some embodiments, the ring-shaped body 510 comprises a ceramic material. The ring-shaped body 510 has a top surface 512 and a bottom surface 514 defining a thickness of the ring-shaped body, an inner peripheral face 516 and an outer peripheral face 518 defining a width of the ring-shaped body 510, and a plurality of openings 520 on the top surface 512 and the inner peripheral face 516.

The ring-shaped body 510 can have any suitable thickness. In some embodiments, the thickness of the ring-shaped body 510 is in a range of from 0.3 inches to 0.7 inches. The ring-shaped body 510 can have any suitable width. In some embodiments, the width of the ring-shaped body 510 is in a range of from 1 inch to 1.5 inches.

The ring-shaped body 510 may include any suitable number of openings 520. The plurality of openings 520 extend through a portion of the thickness and a portion of the width from the inner peripheral face 516 towards the outer peripheral face 518. In one or more non-limiting embodiments, the plurality of openings 520 extends through 20% to 60% of the thickness. In one or more non-limiting embodiments, the plurality of openings extends through 40% to 90% of the width from the inner peripheral face 516 towards the outer peripheral face 518.

Figure 5B:
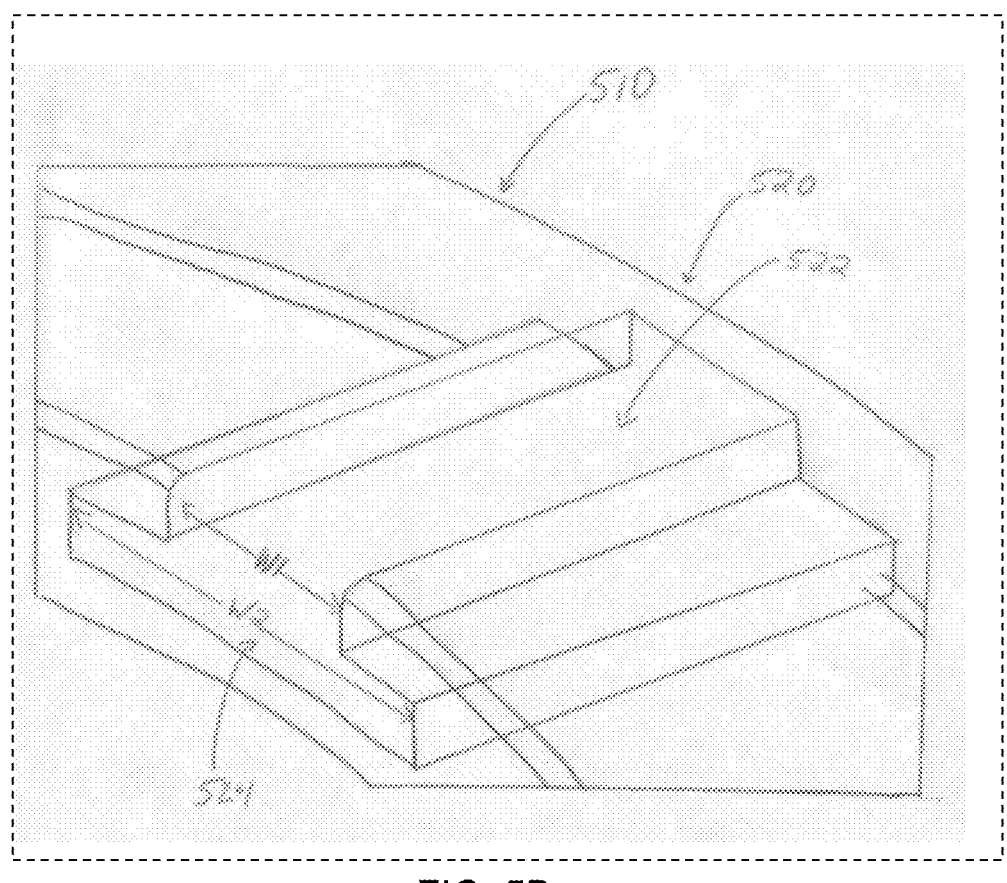
FIG. 5B is a schematic representation of an opening in the ring-shaped body of the lift assembly according to one or more embodiments of the disclosure.

FIG. 5B is a schematic representation of one of the openings 520 in the ring-shaped body 510. Each of the openings 520 have a top portion 522 and a bottom portion 524. The top portion 522 has a first width W1 and the bottom portion 524 has a second width W2. In some embodiments, the second width W2 is greater than the first width W1. In some embodiments, the first width W1 is in a range of from 0.7 inches to 1 inch. In some embodiments, the second width W2 is in a range of from 1.2 inches to 1.5 inches.

Figure 5C:
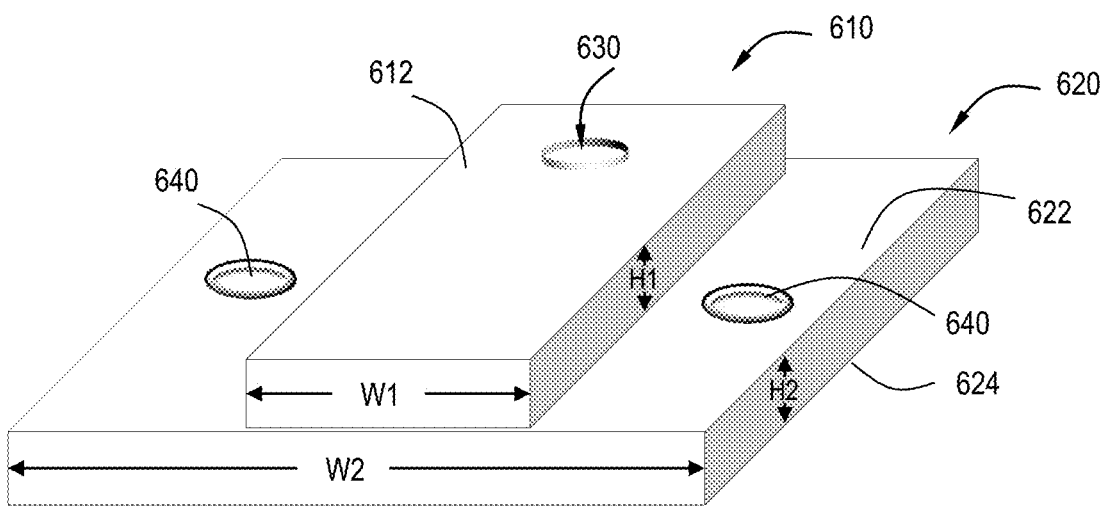
FIG. 5C is a schematic representation of a movable block of the lift assembly according to one or more embodiments of the disclosure.

FIG. 5C is a schematic representation of one of the movable blocks 600 of the lift assembly 500. Each movable block 600 has a top portion 610 and a bottom portion 620. The top portion 610 has a top surface 612, and the bottom portion 620 has a top surface 622 and a bottom surface 624. The top surface 612 of the top portion 610 and the top surface 622 of the bottom portion 620 define a height H1 of the top portion 610. The top surface 622 of the bottom portion 620 and the bottom surface 624 of the bottom portion 620 define a height H2 of the bottom portion 620. The combination of the height H1 of the top portion 610 and the height H2 of the bottom portion 620 defines a total height (e.g., H1+H2) of the movable block 600. In some embodiments, the height H1 of the top portion 610 is greater than the height H2 of the bottom portion 620. In some embodiments, the height H1 of the top portion 610 is in a range of from 0.1 inches to 0.15 inches. In some embodiments, the height H2 of the bottom portion 620 is in a range of from 0.1 inches to 0.15 inches. In some embodiments, the height H1 of the top portion 610 and the height H2 of the bottom portion 620 are the same.

The movable block 600 comprises a hole 630 extending through the top surface 612 into the top portion 610. In some embodiments, the hole 630 extends into a portion of the first height H1 of the movable block 600. In some embodiments, the hole 630 extends into a portion of the first height H1 and a portion of the second height H2 of the movable block 600. In some embodiments, the hole 630 is a threaded opening.

The movable block 600 comprises at least one indentation 640 in the top surface 622 of the bottom portion 620. The movable block 600 may include any suitable number of indentations 640. In the illustrated embodiment of FIG. 50, the movable block 600 includes two indentations 640 in the top surface 622 of the bottom portion 620.

The top portion 610 of the movable block 600 defines a first width W1 and the bottom portion 620 of the movable block 600 defines a second width W2. In some embodiments, the second width W2 is greater than the first width W1.

In some embodiments, the first width W1 of the top portion 610 is in a range of from 0.5 inches to 0.8 inches. In some embodiments, the second width W2 of the bottom portion 620 is in a range of from 1.2 inches to 1.8 inches.

In one or more embodiments, the top portion 610 of the movable block 600 and the bottom portion 620 of the movable block 600 are separate components. In some embodiments, the top portion 610 of the movable block 600 and the bottom portion 620 of the movable block 600 are integrally formed as a single component. The movable block 600 may include any suitable material known to the skilled artisan. In some embodiments, the movable block 600 includes any material in which a hole 630 extending into the top portion 610 can be formed. In some embodiments, the movable block comprises 600 a ceramic material. In one or more embodiments, the ring-shaped body 510 and the movable block 600 comprise the same ceramic material.

Figure 5D:
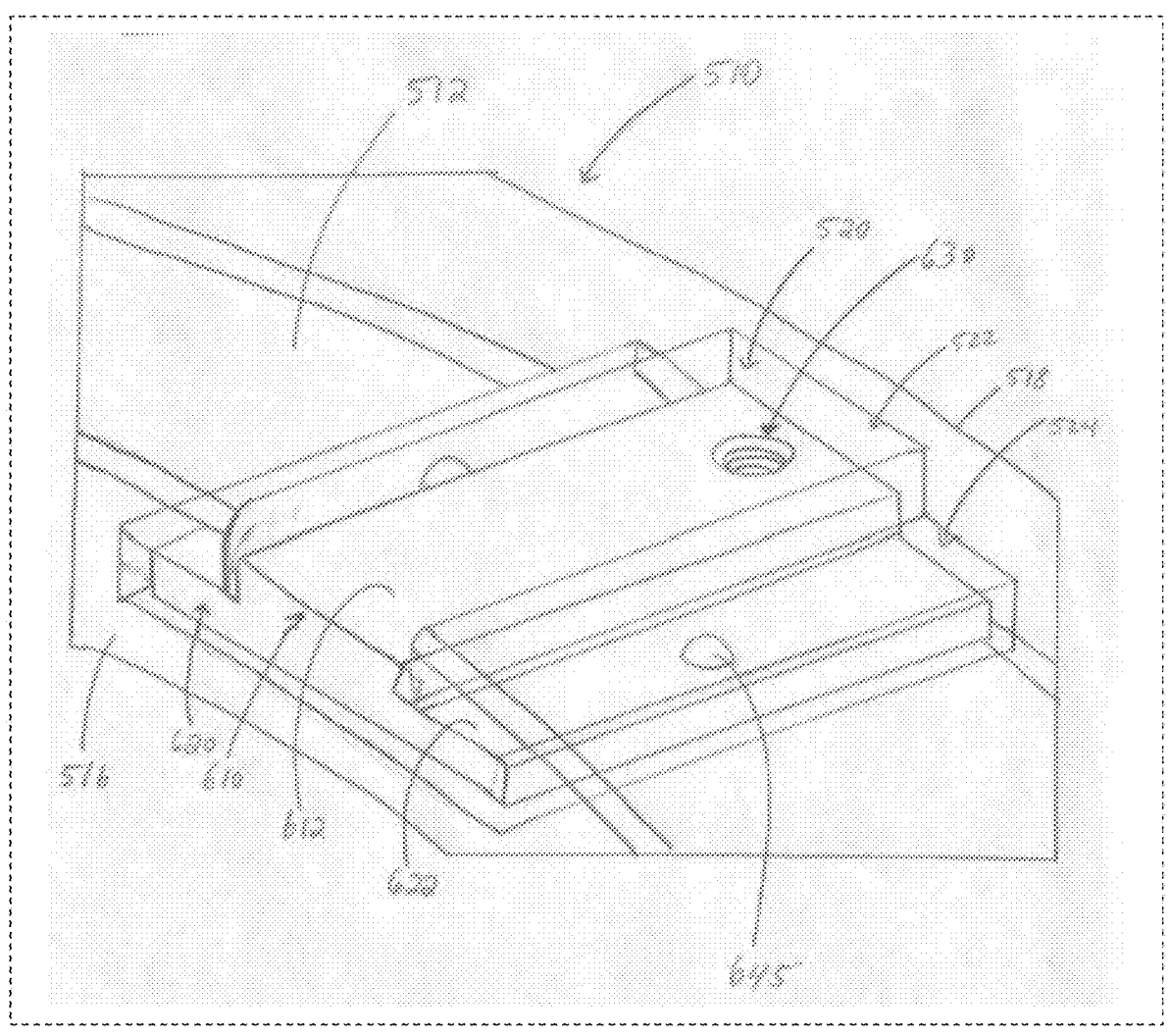
FIG. 5D is a schematic representation of the movable block cooperatively interacting with the opening in the ring-shaped body of the lift assembly according to one or more embodiments of the disclosure.

FIG. 5D is a schematic representation of the movable block 600 cooperatively interacting with the opening 520 in the ring-shaped body 510. In one or more illustrated embodiments, the top surface 612 of the top portion 610 of the movable block 600 is below the top surface 512 of the ring-shaped body 510. Stated differently, there is a distance D between the top surface 512 of the ring-shaped body 510 and the top surface 612 of the top portion 610 of the movable block 600. In some embodiments, the distance D between the top surface 512 of the ring-shaped body 510 and the top surface 612 of the top portion 610 of the movable block 600 is in a range of from 1 mm to 1.5 mm. In one or more illustrated embodiments, the bottom surface 624 of the bottom portion 620 of the movable block 600 cooperatively interacts with the bottom portion 524 of the opening 520.

In some embodiments, the first width W1 and the second width W2 of the opening 520 are greater than the first width W1 and the second width W2 of the movable block 600. In some embodiments, there is a gap (e.g., a first gap G1) between the first width W1 of the opening 520 and the first width W1 of the movable block 600. In some embodiments, there is a gap (e.g., a second gap G2) between the second width W2 of the opening 520 and the second width W2 of the movable block 600. In one or more embodiments, the first gap G1 and the second gap G2 are configured to accommodate some translation of the movable block 600 during operation. As used herein, the term "some translation" means any amount of translation that does not result in tilting of lift pins during operation. The first gap G1 and the second gap G2 may be any suitable size such that the first gap G1 and the second gap G2 are configured to accommodate some translation of the movable block during operation. In some embodiments, the second gap G2 is larger than the first gap G1. In some embodiments, the first gap G1 is the same size as the second gap G2.

The movable block 600 comprises at least one indentation 640 in the top surface 622 of the bottom portion 620. In the illustrated embodiment of FIG. 5D, the movable block 600 includes two indentations 640 in the top surface 622 of the bottom portion 620 and two complementary sized ball bearings 645 in the two indentations 640. The ball bearings 645 advantageously reduce friction during translation of the movable block 600 into and out of the opening 520. Advantageously, the ball bearings ensure a cooperative interaction between the movable block 600 and the opening 520 to eliminate lift pin tilting.

The ball bearings 645 may comprise any suitable material known to the skilled artisan. In some embodiments, the ball bearings 645 a ceramic material. In one or more embodiments, each of the ring-shaped body 510, the movable block 600, and the ball bearings 645 comprise the same ceramic material.

Figure 5E:
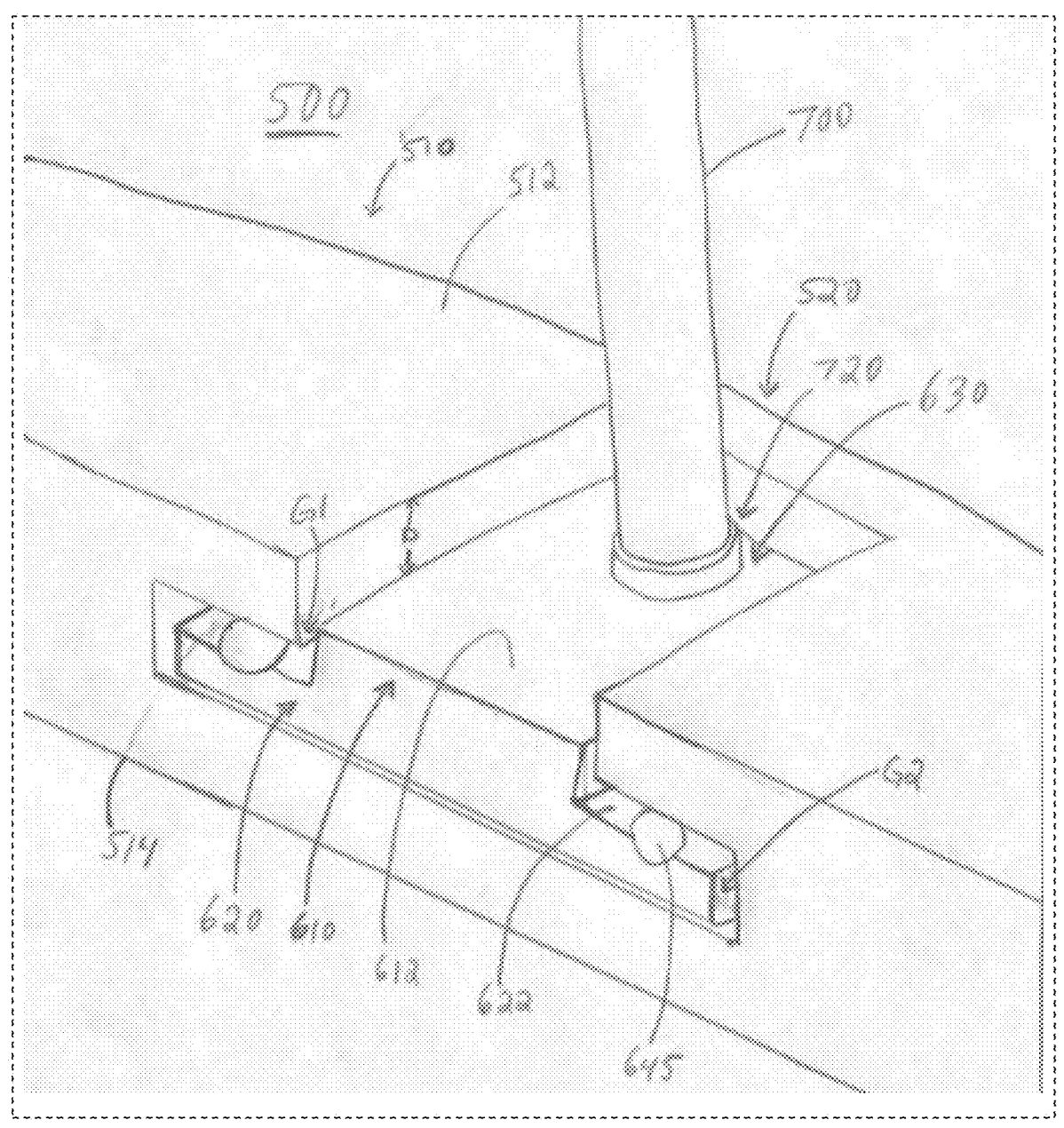
FIG. 5E is a schematic representation of a lift pin cooperatively interacting with a hole in a movable block that is positioned in the opening in the ring-shaped body of the lift assembly according to one or more embodiments of the disclosure.

FIG. 5E is a schematic representation of a lift pin 700 cooperatively interacting with the hole 630 in the movable block 600 positioned in the opening 520 in the ring-shaped body 510. The illustrated embodiment of FIG. 5E includes the lift assembly 500, the ring-shaped body 510, the movable block 600, and the lift pin 700. When the lift pin 700, which is described further below, is rotated into the hole 630 of the movable block 600, the lift pin 700, advantageously, does not tilt during operation.

Figure 6A:
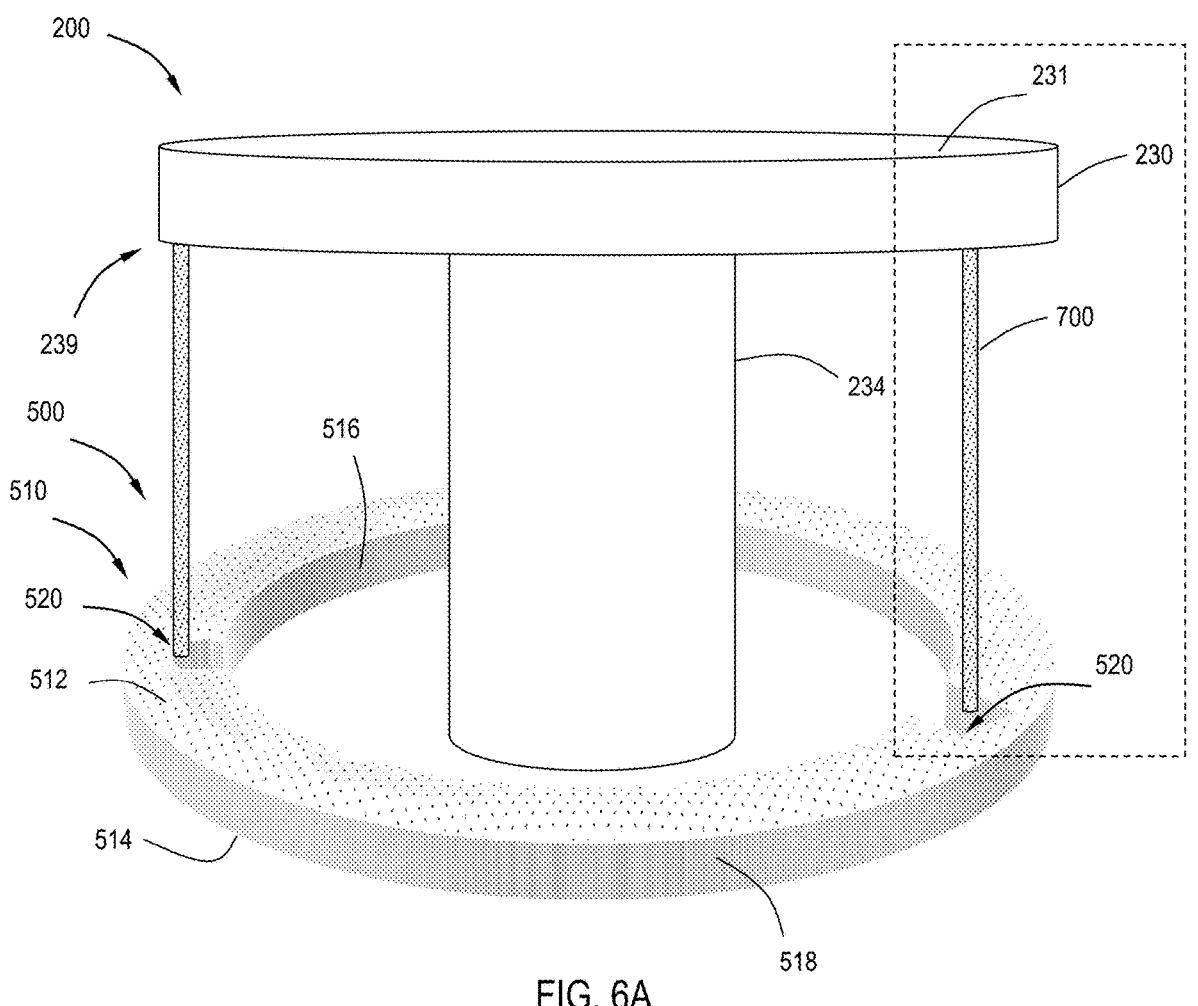
FIG. 6A is a schematic representation of a support assembly connected to the lift assembly by a plurality of lift pins according to one or more embodiments of the disclosure.
Figure 6B:
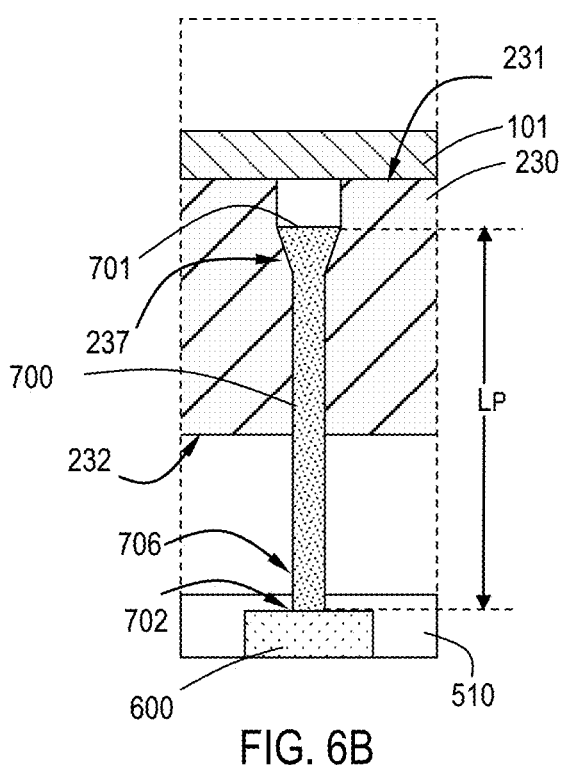
FIG. 6B is a partial schematic view of a lift pin in a processing position according to one or more embodiments of the disclosure.
Figure 6C:
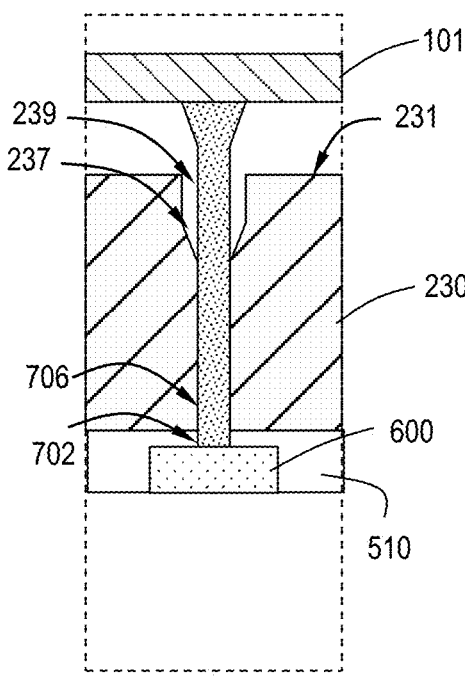
FIG. 6C is a partial schematic view of a lift pin in an exchange position according to one or more embodiments of the disclosure.

FIG. 6A is a schematic representation of the support assembly 200 connected to the lift assembly 500 by a plurality of lift pins 700. The skilled artisan will recognize that additional components will be provided in a semiconductor manufacturing processing chamber 100, as described with respect to FIGS. 1 and 2. The skilled artisan will also recognize that description of the additional components is not needed in this section of the disclosure in order to understand the operation of the support assembly 200 connected to the lift assembly 500 by the plurality of lift pins 700. FIG. 6B is a partial schematic view of a lift pin 700 in a processing position. FIG. 6C is a partial schematic view of a lift pin 700 in an exchange position.

Some embodiments of the disclosure advantageously prevent lift pin tilting. Some embodiments of the disclosure advantageously provide a seal between the top end 701 of the lift pins 700 and the openings 239 in the top surface 231.

Some embodiments of the disclosure incorporate at least three lift pins 700 positioned within openings 239 in each of the substrate supports 230. The openings 239 pass through the entire thickness of the substrate support 230 allowing the lift pins 700 to be dropped into the openings 239 through the support surfaces 231 and easily removed. The number of lift pins 700 can be varied and is not limited to three. In some embodiments, there are more or less than three lift pins 700. In some embodiments, there are at least four, five or six lift pins 700.

The lift assembly 500 may include any suitable number of movable blocks 600. The number of movable blocks 600 corresponds to the number of openings 520 in the ring-shaped body 510. Each of the openings 520 may be spaced a distance apart from one another. In some embodiments, each of the openings 520 are spaced equidistantly apart. In one or more embodiments, the number of movable blocks 600 (and number of openings 520 in the ring-shaped body 510) corresponds to the number of lift pins 700. In one or more illustrated embodiments, the lift assembly 500 includes three movable blocks 600 and the semiconductor manufacturing processing chamber 100 includes three lift pins 700. In embodiments where the lift assembly 500 includes three movable blocks 600 and the semiconductor manufacturing processing chamber 100 includes three lift pins 700, each of the openings 520 in the ring-shaped body 510 are spaced 120° apart.

Each of the lift pins 700 has a top end 701 and a bottom end 702 defining a length $L_P$ of the lift pin 700. The length $L_P$ of the lift pins 700 can be varied. In some embodiments, the length $L_P$ of the lift pins 700 is greater than the thickness of the substrate support 230 so that a portion of the lift pin 700 can be above the support surface 231 and a portion of the lift pin 700 can be below the bottom surface 232 of the substrate support 230 at any given time. The length $L_P$ of the lift pins 700 in some embodiments is minimized to prevent wobbling of the lift pins 700 within the opening 239. In some embodiments, the length $L_P$ of the lift pin 700 is in a range of from 2 inches to 4 inches.

The lift pins 700 and openings 239 of some embodiments are configured to cooperatively interact to prevent the top end 701 of the lift pins 700 from passing fully through the bottom surface 232 of the substrate support 230. In one or more embodiments, the top end 701 of the lift pins 700 define a convex top surface. The top end portion 704 of the lift pin 700 illustrated has a flared shape that interacts with a complementary flared shape 237 along the length of the opening 239. In some embodiments, as shown in FIGS. 6B and 6C, the complementary flared shape 237 in the opening 239 is positioned within the thickness of the substrate support 230 sufficient so that when in the processing position, the top end 701 of the lift pin 700 is recessed below the support surface 231. In some embodiments, when the process chamber is in the process position, the top end 701 of the lift pins 700 are substantially coplanar with or below the support surface 231 of the substrate support 230.

While the top end portion 704 of the lift pin 700 is illustrated with a conical flare, the skilled artisan will recognize that this is merely one possible configuration and that the top end 701 of the lift pin 700 can have any suitable shape. The complementary shape formed in the opening 239 of some embodiments mimics the shape of the top end portion 704. In some embodiments, the opening 239 has some irregularity that cooperatively interacts with the lift pin 700 to prevent the lift pin 700 from falling out of the substrate support 230.

In some embodiments, the lift pins 700 and openings 239 are configured to prevent tilting of the lift pins 700 within the openings 239. The size of the lift pin 700 and/or opening 239 are different so that a gap is formed between the pin and opening. The size of the gap—also referred to as the tolerance—is sufficiently small to prevent tilting. When top end 701 of the lift pins 700 and openings 239 in the substrate support 230 cooperatively interact and the bottom end 702 of the lift pins 700 are rotated into the complementary threaded opening of the hole 630 of the movable block 600, there is no tilting of the lift pins 700.

The lift pins 700 can be made out of any suitable material. In some embodiments, the lift pins 700 are made of a thermally and/or electrically conductive material. In some embodiments, the lift pins 700 comprise one or more of aluminum nitride, aluminum oxide, stainless steel, stainless steel coated with aluminum oxide or silicon carbide. In some embodiments the lift pins 700 have no auxiliary weight to prevent wobble of the lift pins 700.

Some embodiments of the disclosure are directed to controllers 490 having one or more configurations to execute individual processes or sub-processes to perform embodiments of the method described herein. The controller 490 can be connected to and configured to operate intermediate components to perform the functions of the methods. For example, the controller 490 of some embodiments is connected to (directly or indirectly) and configured to control one or more of gas valves, actuators, motors, access ports, vacuum control, etc. Some embodiments are directed to non-transitory computer readable medium configured to execute embodiments of the method.

In some embodiments, a non-transitory computer readable medium, includes instructions, that, when executed by a controller (e.g., controller 490 of a processing chamber (e.g., processing chamber 100), causes the processing chamber: transfer a substrate into and out of the processing chamber by a robot blade through an insertion/removal opening in a side of the processing chamber; move the substrate from the robot blade at an upper loading position to a lower processing position in which the substrate is placed on a substrate support, move the substrate comprising raising and then lowering a plurality of lift pins under the control of a motor; provide a lift assembly (such as lift assembly 500) to raise and lower the plurality of lift pins, wherein a plurality of lift pins extend through a bottom surface of the substrate support to a hole in a movable block of the lift assembly.

Additional embodiments of the present disclosure are directed to processing methods. The processing methods include transferring a substrate into and out of a processing chamber by a robot blade through an insertion/removal opening in a side of the processing chamber; moving the substrate from the robot blade at an upper loading position to a lower processing position in which the substrate is placed on a substrate support, moving the substrate comprising raising and then lowering a plurality of lift pins under the control of a motor. The processing method comprises providing a lift assembly to raise and lower the plurality of lift pins. The lift assembly comprises a ring-shaped body having a top surface and a bottom surface defining a thickness of the ring-shaped body, an inner peripheral face and an outer peripheral face defining a width of the ring-shaped body, and a plurality of openings on the top surface and inner peripheral face. The plurality of openings extend through a portion of the thickness and a portion of the width from the inner peripheral face towards the outer peripheral face. Each of the openings have a top portion and a bottom portion, the top portion having a first width and the bottom portion having a second width, the second width greater than the first width. The lift assembly also includes a plurality of movable blocks, each movable block having a top portion and a bottom portion, the top portion having a top surface, the bottom portion having a top surface and a bottom surface, the top portion defining a first width and the bottom portion defining a second width, the second width greater than the first width. The movable block is configured to cooperatively interact with one or more of the plurality of openings of the ring-shaped body, and the movable block comprises a hole extending into the top portion. The plurality of lift pins extend through the bottom surface of the substrate support to the hole in the movable block Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A lift assembly for a semiconductor manufacturing processing chamber, the lift assembly comprising:
   a ring-shaped body having a top surface and a bottom surface defining a thickness of the ring-shaped body, an inner peripheral face and an outer peripheral face defining a width of the ring-shaped body, and a plurality of openings on the top surface and the inner peripheral face, the plurality of openings extending through a portion of the thickness and a portion of the width from the inner peripheral face towards the outer peripheral face, each of the plurality of openings having a top portion and a bottom portion, the top portion having a first width and the bottom portion having a second width, the second width greater than the first width; and
   a plurality of movable blocks, each of the plurality of movable blocks having a top portion and a bottom portion, the top portion having a top surface, the bottom portion having a top surface and a bottom surface, the top portion defining a first width and the bottom portion defining a second width, the second width greater than the first width, each of the plurality of movable blocks configured to cooperatively interact with one or more of the plurality of openings of the ring-shaped body, each of the plurality of movable blocks comprising a hole extending into the top portion.

2. The lift assembly of claim 1, wherein the top surface of the top portion and the bottom surface of the bottom portion define a height of the respective movable block.

3. The lift assembly of claim 2, wherein the hole extends into a portion of the height of the respective movable block.

4. The lift assembly of claim 1, wherein the hole in each of the plurality of movable blocks is a threaded opening.

5. The lift assembly of claim 1, wherein each of the plurality of movable blocks comprises at least one indentation in the top surface of the bottom portion.

6. The lift assembly of claim 5, wherein each of the plurality of movable blocks further comprises a ball bearing in the at least one indentation.

7. The lift assembly of claim 1, wherein the first width and the second width of each of the plurality of openings are greater than the first width and the second width of a corresponding one of the plurality of movable blocks, respectively.

8. The lift assembly of claim 1, wherein there is a gap between the first width of each of the plurality of openings and the first width of a corresponding one of the plurality of movable blocks.

9. The lift assembly of claim 1, wherein there is a gap between the second width of each of the plurality of openings and the second width of a corresponding one of the plurality of movable blocks.

10. The lift assembly of claim 1, comprising three openings and three movable blocks.

11. The lift assembly of claim 10, wherein the plurality of openings are spaced 120° apart.

12. The lift assembly of claim 1, wherein each of the plurality of movable blocks comprises a ceramic material.

13. A semiconductor manufacturing processing chamber comprising:
   a substrate support having a support surface and a bottom surface, the support surface comprising a plurality of openings, the support surface configured to support a wafer during processing;
   a substrate support shaft connected to and extending from the bottom surface of the substrate support, the substrate support shaft having a location that is aligned with a central axis of the processing chamber;
   a lift assembly spaced a distance from the bottom surface of the substrate support, the lift assembly comprising:
   a ring-shaped body having a top surface and a bottom surface defining a thickness of the ring-shaped body, an inner peripheral face and an outer peripheral face defining a width of the ring-shaped body, and a plurality of openings on the top surface extending through a portion of the thickness and from the inner peripheral face towards the outer peripheral face, each of the plurality of openings on the top surface having a top portion and a bottom portion, the top portion having a first width and the bottom portion having a second width, the second width greater than the first width; and a plurality of movable blocks, each of the plurality of movable blocks having a top portion and a bottom portion, the top portion having a top surface, the bottom portion having a top surface and a bottom surface, the top portion defining a first width and the bottom portion defining a second width, the second width greater than the first width, each of the plurality of movable blocks configured to cooperatively interact with one or more of the plurality of openings of the ring-shaped body, each of the plurality of movable blocks comprising a hole extending into the top portion; and a plurality of lift pins positioned within the plurality of openings in the support surface, the plurality of lift pins extending through the bottom surface of the substrate support to the holes in the plurality of movable blocks.

14. The processing chamber of claim 13, wherein each of the plurality of movable blocks comprises at least one indentation in the top surface of the bottom portion.

15. The processing chamber of claim 14, wherein each of the plurality of movable blocks further comprises a ball bearing in the at least one indentation.

16. The processing chamber of claim 13, each of the plurality of lift pins has a top end and a bottom end defining a length of the lift pins.

17. The processing chamber of claim 16, wherein the bottom end of each of the plurality of lift pins is threaded and the hole in each of the plurality of movable blocks has a threaded opening.

18. The process chamber of claim 16, wherein the top end of each of the plurality of lift pins has a convex top surface and a flared width, and the plurality of openings in the substrate support have a flared surface to prevent the top ends of the plurality of lift pins from passing through the bottom surface of the substrate support.

19. The process chamber of claim 16, wherein the plurality of lift pins and the plurality of openings in the substrate support are configured to prevent the plurality of lift pins from tilting.

20. A processing tool comprising:

a central transfer station comprising a robot configured to move a wafer;

a plurality of process stations, each process station connected to the central transfer station and providing a processing region separated from processing regions of adjacent process stations, the plurality of process stations comprising at least one semiconductor manufacturing processing chamber, the at least one semiconductor manufacturing processing chamber comprising a lift assembly according to claim 1 spaced a distance from a bottom surface of a substrate support; and a controller connected to the central transfer station and the plurality of process stations, the controller configured to activate the robot to move the wafer between the process stations, and to control one or more processes occurring in each of the process stations.

* * * * *